(12) United States Patent
Boni et al.

(10) Patent No.: US 12,270,990 B2
(45) Date of Patent: Apr. 8, 2025

(54) MICROELECTROMECHANICAL MIRROR DEVICE WITH PIEZOELECTRIC ACTUATION AND IMPROVED OPENING ANGLE

(71) Applicant: STMicroelectronics S.r.l., Agrate Brianza (IT)

(72) Inventors: Nicolo' Boni, Mountain View, CA (US); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 547 days.

(21) Appl. No.: 17/727,117

(22) Filed: Apr. 22, 2022

(65) Prior Publication Data

US 2022/0342203 A1    Oct. 27, 2022

(30) Foreign Application Priority Data

Apr. 27, 2021  (IT) ........................ 102021000010616

(51) Int. Cl.
  *G02B 26/08*  (2006.01)
  *G01L 1/18*   (2006.01)
(52) U.S. Cl.
  CPC ............ *G02B 26/0858* (2013.01); *G01L 1/18* (2013.01)
(58) Field of Classification Search
  CPC .............. G02B 26/0858; G02B 26/101; G02B 26/105; G01L 1/18; B81B 2203/0109; B81B 2203/0163; B81B 3/0043; B81B 2201/042; B81B 5/00; G03B 21/28
  See application file for complete search history.

(56) References Cited

U.S. PATENT DOCUMENTS

| 2013/0070167 A1 | 3/2013 | Tagami et al. |
| 2020/0049976 A1 | 2/2020 | Grasshoff |
| 2021/0356733 A1* | 11/2021 | Baran .................. G02B 26/101 |

FOREIGN PATENT DOCUMENTS

EP           3666727 A1    6/2020

OTHER PUBLICATIONS

EP Search Report and Written Opinion for family-related EP Appl. No. 22169585.1, report dated Jun. 13, 2022, 9 pgs.
IT Search Report and Written Opinion for priority application, IT 102021000010616, report dated Jan. 21, 2022, 10 pgs.

* cited by examiner

*Primary Examiner* — Euncha P Cherry
(74) *Attorney, Agent, or Firm* — Crowe & Dunlevy LLC

(57) ABSTRACT

A microelectromechanical mirror device includes a fixed structure defining a cavity, a tiltable structure elastically suspended above the cavity and carrying a reflecting surface, and having a main extension in a horizontal plane. A first pair of driving arms carry respective piezoelectric material regions that are biased to cause a rotation of the tiltable structure around a first rotation axis parallel to a first horizontal axis of the horizontal plane, and elastically coupled to the tiltable structure. Elastic suspension elements that couple the tiltable structure to the fixed structure at the first rotation axis are stiff with respect to movements out of the horizontal plane and yielding with respect to torsion around the first rotation axis, and further extend between the tiltable structure and the fixed structure. The elastic suspension elements have an asymmetrical arrangement on opposite sides of the tiltable structure along the first rotation axis.

21 Claims, 5 Drawing Sheets

| Torsional stiffness | Width | Opening angle [Deg] | Δ[%] | Sensitivity [mV/V/deg] | Δ[%] |
|---|---|---|---|---|---|
| Ref. | Ref. | 12.7 | - | 1.45 | - |
| -14.8% | -0.4μm | 13.14 | +3.5% | 1.30 | -10.2% |
| -28% | -0.8μm | 13.63 | +7.3% | 1.14 | -21.1% |
| -39.8% | -1.2μm | 14.13 | +11.2% | 1.00 | -31.2% |

MICROELECTROMECHANICAL MIRROR DEVICE WITH PIEZOELECTRIC ACTUATION AND IMPROVED OPENING ANGLE

PRIORITY CLAIM

This application claims the priority benefit of Italian Application for Patent No. 102021000010616, filed on Apr. 27, 2021, the content of which is hereby incorporated by reference in its entirety to the maximum extent allowable by law.

TECHNICAL FIELD

This disclosure relates to a microelectromechanical mirror device made using microelectromechanical system (MEMS) technology with piezoelectric actuation and an improved opening or aperture angle.

BACKGROUND

Microelectromechanical systems (MEMS) mirror devices are used in portable apparatuses, such as for example smartphones, tablets, notebooks, and PDAs for optical applications, in particular, to direct light radiation beams generated by a light source (for example laser beams) in a desired manner. Due to their small size, these MEMS devices allow stringent requirements regarding space occupation, in terms of area and thickness, to be complied with.

For example, microelectromechanical mirror devices are used in miniaturized projectors apparatuses (so-called picoprojectors), capable of projecting images from a distance and generating desired light patterns.

MEMS mirror devices generally include a tiltable structure carrying a suitable reflecting (or mirror) surface, elastically supported above a cavity and made from a body of semiconductor material, so as to be movable, for example with tilt or rotation movement out of a main extension plane, to direct the incident light beam in a desired manner.

The rotation of the mirror device is controlled through an actuation system which may be, for example, of electrostatic, electromagnetic or piezoelectric type.

Electrostatic actuation systems generally have the disadvantage of requiring high operating voltages, while electromagnetic actuation systems generally entail high power consumption; it has therefore been proposed to control movement of the tiltable mirror structure with piezoelectric actuation.

MEMS mirror devices with piezoelectric actuation have the advantage of requiring reduced actuation voltages and power consumption with respect to devices with electrostatic or electromagnetic actuation. Furthermore, it is possible to exploit the inverse piezoelectric effect to provide piezoresistive sensor elements for sensing the driving state of the mirror and providing a feedback signal to allow a feedback control of the actuation.

Known mirror devices with piezoelectric actuation have limitations that prevent full exploitation of their advantages.

In particular, there are applications wherein it is desired for the opening angle of the tiltable mirror structure (that is, the extent of rotation out of the plane) to be increased, without increasing the size of the microelectromechanical device, without reducing the feedback signal provided by the piezoresistive sensor, and without compromising the reliability of the device.

Known solutions do not allow this need to be easily satisfied. Therefore, further development is needed.

SUMMARY

In an embodiment, a microelectromechanical mirror device includes a piezoelectric actuation having an improved opening angle.

To that end, the microelectromechanical mirror device includes: a fixed structure defining a cavity; a tiltable structure carrying a reflecting surface, elastically suspended above the cavity and having a main extension in a horizontal plane; at least one first pair of driving arms, elastically coupled to the tiltable structure and carrying respective piezoelectric material regions configured to be biased to cause a rotation of the tiltable structure around at least one first rotation axis parallel to a first horizontal axis of the horizontal plane; and elastic suspension elements, configured to couple the tiltable structure elastically to the fixed structure at the first rotation axis, stiff with respect to movements out of the horizontal plane and yielding with respect to torsion around the first rotation axis, the elastic suspension elements extending between the tiltable structure and the fixed structure; wherein the elastic suspension elements have an asymmetrical arrangement on opposite sides of the tiltable structure along the first horizontal axis.

BRIEF DESCRIPTION OF THE DRAWINGS

For a better understanding, preferred embodiments are now described, purely by way of non-limiting example, with reference to the attached drawings, wherein.

DETAILED DESCRIPTION

Figure 1:
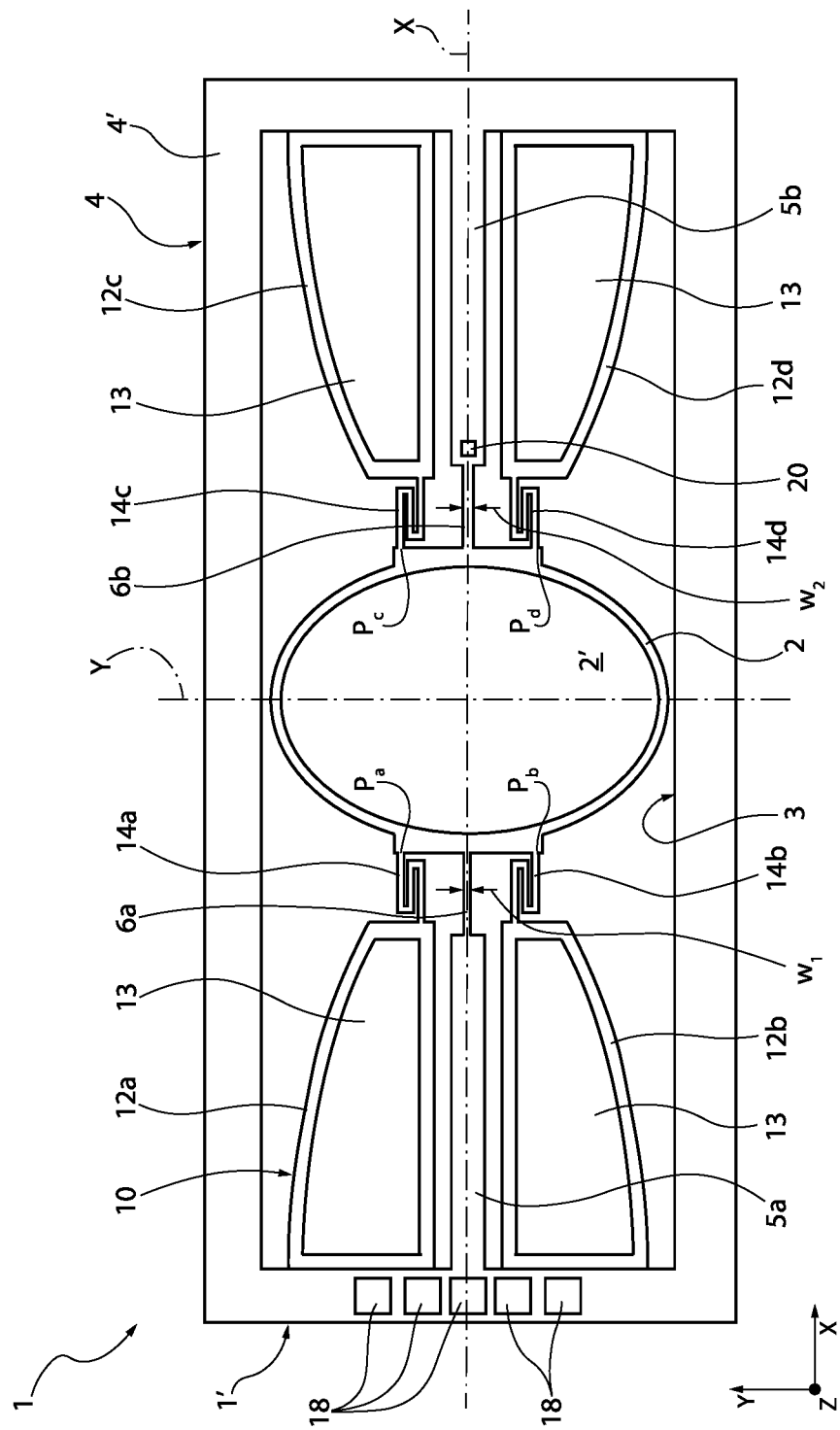
FIG. 1 shows a schematic plan view of a microelectromechanical mirror device, according to an embodiment of this disclosure.

FIG. 1 schematically illustrates a microelectromechanical mirror device, based on MEMS technology, indicated as a whole with 1; this device generally has the structure described in detail in United States Patent Application No. 2020/0192199 (corresponding to European Patent Number EP3,666,727A1), the contents of which are incorporated by reference.

The microelectromechanical device 1 is formed in a die 1' of semiconductor material, in particular silicon, and is provided with a tiltable structure 2 having a main extension in a horizontal plane xy and arranged to rotate around a rotation axis, parallel to a first horizontal axis x of the aforementioned horizontal plane xy.

The aforementioned rotation axis represents a first median axis of symmetry X for the microelectromechanical device 1; a second median axis of symmetry Y for the same microelectromechanical device 1 is parallel to a second horizontal axis y, orthogonal to the first horizontal axis x and defining, with the same first horizontal axis x, the horizontal plane xy.

The tiltable structure 2 is suspended above a cavity 3, formed in the die 1', and defines a supporting structure, which carries a reflecting surface 2' at the top, to define a mirror structure.

The tiltable structure 2 is elastically coupled to a fixed structure 4, defined in the same die 1'. In particular, the fixed structure 4 forms, in the horizontal plane xy, a frame 4' which delimits and surrounds the aforementioned cavity 3 and also has a first and a second support (or anchoring) element 5a, 5b, extending longitudinally along the first median axis of symmetry X inside the cavity 3 from the same frame 4', on opposite sides of the tiltable structure 2 (along the first horizontal axis x).

The tiltable structure 2 is supported by the first and the second support elements 5a, 5b, whereto it is elastically coupled through first and second elastic suspension elements 6a, 6b, having a high stiffness with respect to movements out of the horizontal plane xy (along an orthogonal axis z, transverse to the same horizontal plane xy) and yielding with respect to torsion around the first horizontal axis x. The first and second elastic suspension elements 6a, 6b extend overall along the first median axis of symmetry X, between the first and second support elements 5a, 5b and a facing side of the tiltable structure 2, whereto they are coupled at a central portion thereof.

In the illustrated embodiment, the first and second elastic suspension elements 6a, 6b are of a linear type.

The first and second elastic suspension elements 6a, 6b couple the tiltable structure 2 to the fixed structure 4, allowing it to rotate around the first rotation axis and providing a high stiffness with respect to movements out of the plane, thus providing for a high ratio between the frequencies of spurious movements out of the horizontal plane xy and the rotation frequency around the first rotation axis.

The microelectromechanical device 1 further comprises an actuation structure 10, coupled to the tiltable structure 2 and configured to cause rotation thereof around the first rotation axis; the actuation structure 10 is interposed between the tiltable structure 2 and the fixed structure 4 and also contributes to supporting the tiltable structure 2 above the cavity 3.

This actuation structure 10 comprises a first pair of driving arms formed by first and second driving arms 12a, 12b, arranged on opposite sides of, and symmetrically with respect to, the first median axis of symmetry X and the first support element 5a, and having a longitudinal extension parallel to the first horizontal axis x and to the aforementioned first support element 5a.

In the embodiment illustrated in FIG. 1, the driving arms 12a, 12b have a generically trapezoidal (or "fin") shape, with the longer side parallel to the second horizontal axis y integrally coupled to the frame 4' of the fixed structure 4 and the shorter side parallel to the same second horizontal axis y elastically coupled to the tiltable structure 2. Each driving arm 12a, 12b therefore has a respective first end integrally coupled to the frame 4' of the fixed structure 4 and a respective second end elastically coupled to the tiltable structure 2, through first and second elastic decoupling elements 14a, 14b.

Each driving arm 12a, 12b is suspended above the cavity 3 and carries, at a top surface thereof (opposite to the same cavity 3) a respective piezoelectric structure 13 (in particular including PZT—Lead Zirconate Titanate), having, for example, substantially the same extension in the horizontal plane xy with respect to the driving arm 12a, 12b.

This piezoelectric structure 13 (in a manner not illustrated in detail) is formed by the superimposition of a bottom electrode region, of a suitable conductive material, arranged above the corresponding driving arm 12a, 12b; a piezoelectric material region (for example made by a thin PZT film) arranged on the aforementioned bottom electrode region; and a top electrode region arranged on the piezoelectric material region.

The aforementioned first and second elastic decoupling elements 14a, 14b have a high stiffness with respect to movements out of the horizontal plane xy (along the orthogonal axis z) and are yielding with respect to torsion (around a rotation axis parallel to the first horizontal axis x). The first and second elastic decoupling elements 14a, 14b extend in parallel with the first horizontal axis x, between the first and second driving arms 12a, 12b and a same facing side of the tiltable structure 2.

The first and the second elastic decoupling elements 14a, 14b are coupled to the tiltable structure 2 at a respective coupling point Pa, Pb, which is located in proximity to the first median axis of symmetry X, at a short distance from the same first median axis of symmetry X. For example, this distance may be comprised between 10 μm and 1500 μm in a typical embodiment and may also be generally comprised between $\frac{1}{10}$ and $\frac{1}{2}$ of the main dimension (in the example along the second median axis of symmetry Y) of the tiltable structure 2.

In any case, the distance between the respective coupling point Pa, Pb and the first median axis of symmetry X is preferably smaller, in particular much smaller, than the distance between the same coupling point Pa, Pb and end or edge portions (taken along the second median axis of symmetry Y) of the tiltable structure 2. In fact, the closer these coupling points Pa, Pb are to the first rotation axis, the greater the ratio between the vertical displacement of the end of the tiltable structure 2 and the vertical displacement of the driving arms 12a, 12b, due to the piezoelectric effect.

In the embodiment illustrated in FIG. 1, the first and the second elastic decoupling elements 14a, 14b are of a folded type, that is they are formed by a plurality of arms having a longitudinal extension parallel to the first horizontal axis x, connected two by two through connecting elements having extension parallel to the second horizontal axis y (in a different embodiment. The elastic decoupling elements 14a, 14b may alternatively be of a linear type).

The aforementioned actuation structure 10 further comprises a second pair of driving arms formed by third and fourth driving arms 12c, 12d, arranged on opposite sides of the first median axis of symmetry X and, this time, of the second support element 5b and having a longitudinal extension parallel to the first horizontal axis x and to the aforementioned second support element 5b. It should be noted that the second pair of driving arms 12c, 12d is therefore arranged symmetrically to the first pair of driving arms 12a, 12b with respect to the second median axis of symmetry Y.

Similarly to what has been discussed for the first pair of driving arms 12a, 12b, each driving arm 12c, 12d of the second pair carries, at a top surface thereof, a respective piezoelectric structure 13 (in particular including PZT—Lead Zirconate Titanate) and has a respective first end integrally coupled to the frame 4' of the fixed structure 4 as well as a respective second end elastically coupled to the tiltable structure 2 through a respective third and fourth elastic decoupling element 14c, 14d (arranged on the opposite side of the first and second elastic decoupling elements 12a, 12b with respect to the second median axis of symmetry Y).

The aforementioned third and fourth elastic decoupling elements 14c, 14d also have a high stiffness with respect to movements out of the horizontal plane xy (along the orthogonal axis z) and are yielding with respect to torsion (around a rotation axis parallel to the first horizontal axis x).

Moreover, as illustrated in the aforementioned FIG. 1, the third and the fourth elastic decoupling elements 14c, 14d are coupled to the tiltable structure 2 at a respective coupling point Pc, Pd, which is located in proximity to the first rotation axis, at the short distance d from the same first rotation axis. Furthermore, the third and the fourth elastic decoupling elements 14c, 14d are also of a folded type.

The microelectromechanical device 1 further comprises a plurality of electrical contact pads 18, carried by the fixed structure 4 at the frame 4', electrically connected (in a manner not shown in detail in the same FIG. 1) to the piezoelectric structures 13 of the driving arms 12a-12d through electrical connection tracks, to allow their electrical biasing through electrical signals coming from the outside of the same electromechanical device 1 (for example provided by a biasing device of an electronic apparatus wherein the electromechanical device 1 is integrated).

Furthermore, the microelectromechanical device 1 comprises a piezoresistive (PZR) sensor 20, suitably arranged to provide a sensing signal associated with the rotation of the tiltable structure 2 around the first rotation axis; this sensing signal may be provided as a feedback to the outside of the microelectromechanical device 1, for example to the aforementioned biasing device, through at least one of the electrical contact pads 18.

In the embodiment illustrated in FIG. 1, this piezoresistive sensor 20 is formed (for example by surface diffusion of doping atoms) at the second support element 5b (however, different arrangements may be provided for the same piezoresistive sensor 20, which may, for example, be similarly formed at the first support element 5a).

Advantageously, the elastic suspension elements 6a, 6b are capable of transmitting the stress to the support elements 5a, 5b and therefore towards the piezoresistive sensor 20, allowing its arrangement at the same support elements 5a, 5b and a resulting simplification of the routing of the electrical connections towards the electrical contact pads 18.

Figures 2, 3:
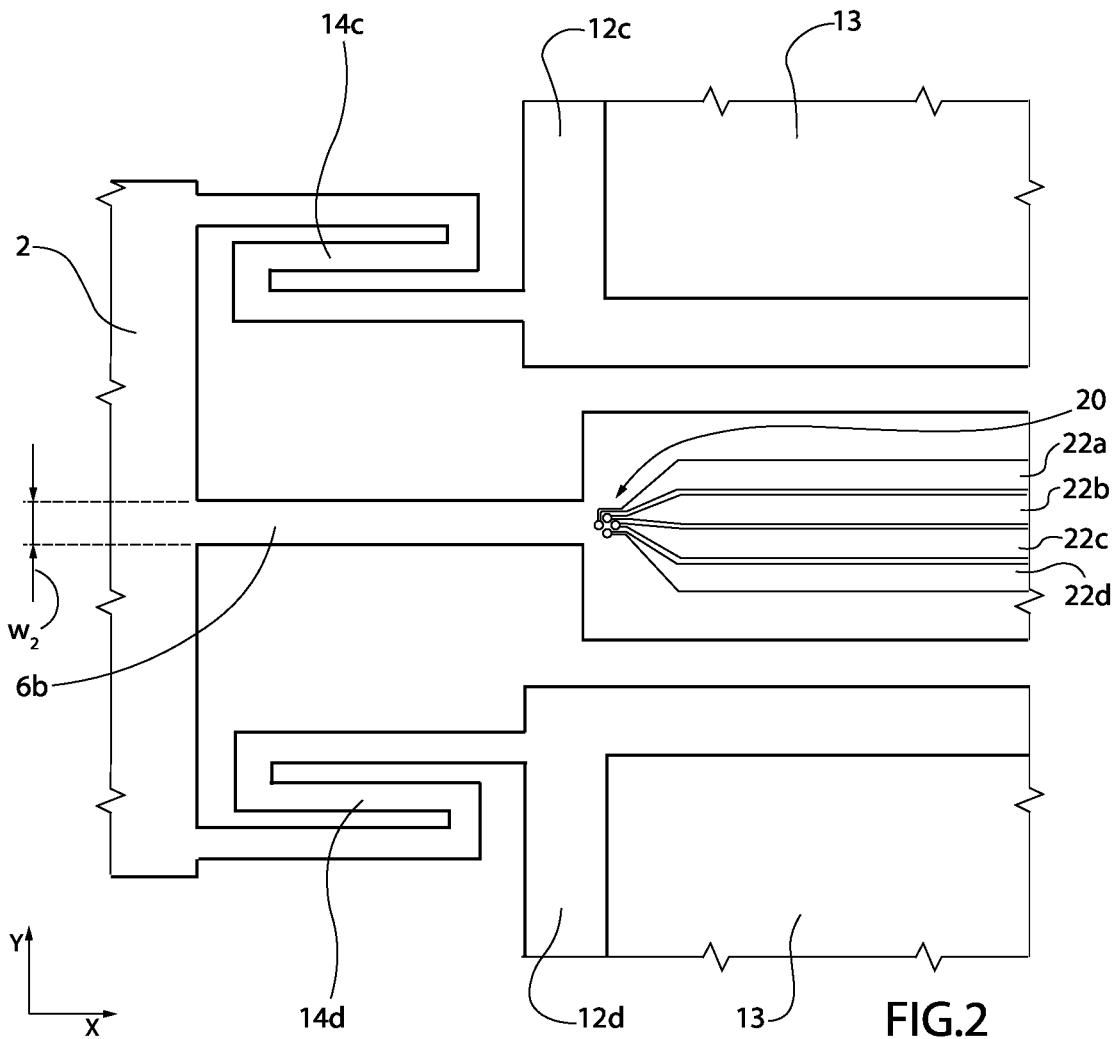
FIG. 2 shows an enlarged portion of the device of FIG. 1, including a corresponding piezoresistive sensor.
FIG. 3 shows a table of quantities relating to the performance of the device of FIG. 1.

As shown in the enlarged detail of FIG. 2 (corresponding to the box highlighted in FIG. 1), the aforementioned piezoresistive sensor 20 may, for example, be formed by four piezoresistor elements which are arranged and connected in a Wheatstone bridge configuration, at the end of the relative support element (in the example of the second support element 5b) coupled to the relative elastic suspension element (in the example to the second elastic suspension element 6b). Four electric connection tracks 22a-22d extend from the aforementioned piezoresistor elements along the corresponding support element, to reach (in a manner not shown here) corresponding electrical contact pads 18.

During operation of the microelectromechanical device 1, the application of a bias voltage to the piezoelectric structure 13 of the first driving arm 12a (having a positive value with respect to the bias of the piezoelectric structure 13 of the second driving arm 12b, which may for example be connected to a ground reference potential), causes a rotation of a positive angle around the first rotation axis (parallel to the first horizontal axis x).

Correspondingly, the application of a bias voltage to the piezoelectric structure 13 of the second driving arm 12b (having a positive value with respect to the bias of the piezoelectric structure 13 of the first driving arm 12a, which may for example in this case be connected to a ground reference potential), causes a corresponding rotation of a negative angle around the same first rotation axis.

It should be noted that the same bias voltage may be applied to the piezoelectric structure 13 of both the first driving arm 12a and the third driving arm 12c, and, similarly, in order to cause the opposite rotation, to the piezoelectric structure 13 of both the second driving arm 12b and the fourth driving arm 12d, to contribute correspondingly to the rotation of the tiltable structure 2 around the first rotation axis (as moreover will become apparent from the previous description).

The elastic decoupling elements 14a-14d elastically decouple the displacement due to the piezoelectric effect of the driving arms 12a-12d along the orthogonal axis z from the resulting rotation of the tiltable structure 2 about the first rotation axis.

In particular, by virtue of the proximity to the rotation axis of the coupling points Pa-Pd between the same elastic decoupling elements 14a-14d and the tiltable structure 2, a high opening angle (i.e. the rotation angle of the tiltable structure 2 around the first rotation axis), or, similarly, a high displacement out of the horizontal plane xy of the end portions (taken along the second horizontal axis y) of the same tiltable structure 2 corresponds to a reduced displacement out of the horizontal plane xy of the aforementioned driving arms 12a-12d; for example, the ratio between the extent of such displacements may be equal to five in a possible embodiment.

The tiltable structure 2 may thus reach high tilt angles (for example >10°) in the face of a low value of the bias voltage (for example <40 V).

Furthermore, the maximum amount of stress occurs in the elastic suspension elements 6a, 6b, which couple the tiltable structure 2 to the fixed structure 4 (the arrangement of the piezoresistive sensor 20 at at least one of the support elements 5a, 5b is therefore advantageous).

Furthermore, also by virtue of the reduced displacement in the direction of the orthogonal axis z of the driving arms 12a-12d (this displacement is reduced even by a factor of ten with respect to prior art solutions), the microelectromechanical device 1 is less subject to shocks acting along the same orthogonal axis z (in other words, a same shock causes a level of stress and a displacement out of the horizontal plane xy which are much lower in the microelectromechanical device 1 with respect to different known solutions).

As previously indicated, there may be a desire to increase the opening angle of the tiltable structure 2 while keeping the size of the die 1' of the microelectromechanical device 1 unaltered and not modifying the arrangement of the piezoelectric structure 13 (of PZT material) of the driving arms 12a-12d.

Decreasing the torsional stiffness associated with the elastic suspension elements 6a, 6b, which couple the tiltable structure 2 to the first and the second support elements 5a, 5b, for example reducing a corresponding width (in the embodiment illustrated in FIG. 1, along the second horizontal axis y).

It has been found that a reduction torsional stiffness, for example a reduction in width associated with the aforementioned elastic suspension elements 6a, 6b (with respect to a reference value "Ref.") determines an increase in the opening angle, as indicated by way of example in the Table shown in FIG. 3 (where different percentage reduction values for the torsional stiffness and width are shown).

However, an unwanted concurrent decrease in the detection sensitivity associated with the piezoresistive sensor 20 (as shown in the same Table of FIG. 3) has been found, which exhibits a faster percentage reduction (A) with the increase of the opening angle with respect to the percentage reduction in the torsional stiffness (or width) of the aforementioned elastic suspension elements 6a, 6b.

The reduction in torsional stiffness, for example associated with a reduction in width, in fact entails a reduction of the stress, which may be transmitted by the elastic suspension elements 6a, 6b to the support elements 5a, 5b and therefore of the stress detected by the piezoresistive sensor 20.

A particular aspect therefore provides, in order to address this issue, an asymmetrical arrangement of the elastic suspension elements 6a, 6b, which have an asymmetrical arrangement on opposite sides of the tiltable structure 2 (along the first horizontal axis x).

In particular, the elastic suspension elements 6a, 6b are formed with a different torsional stiffness (having for example a different width) and the piezoresistive sensor 20 is formed in the proximity of the elastic suspension element having a higher torsional stiffness (with respect to the other elastic suspension element).

In detail, the elastic element associated with the support element, at which no piezoresistive sensor is formed (in the embodiment illustrated in FIG. 1, the first elastic suspension element 6a associated with the first support element 5a), is formed with a first torsional stiffness, for example a first width w1; while the elastic element associated with the support element, at which the piezoresistive sensor 20 is formed (in the embodiment illustrated in the same FIG. 1, the second elastic suspension element 6b associated with the second support element 5b) is formed with a second torsional stiffness, in the example with a second width w2.

In particular, the aforementioned first torsional stiffness is smaller than the second torsional stiffness (and the first width w1 is smaller than the second width w2).

Figure 4:
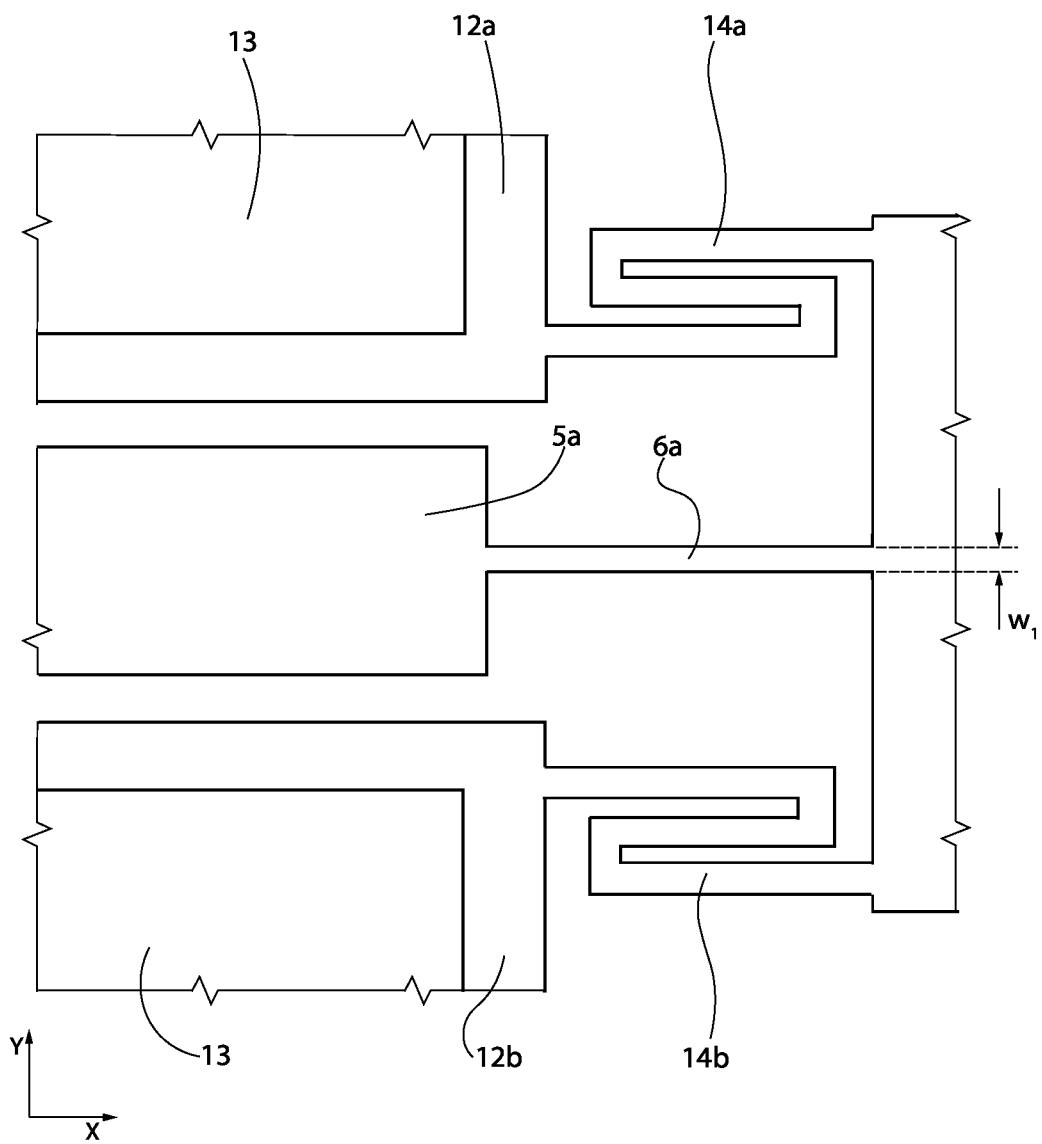
FIG. 4 shows a further enlarged portion of the device of FIG. 1, including a corresponding elastic suspension element.

In the embodiment illustrated in the aforementioned FIG. 1, as also shown in the enlarged images of the aforementioned FIG. 2 and also in FIG. 4, the second elastic suspension element 6b is therefore formed with the second width w2 (which may for example be equal to 9.4 μm); while the first elastic suspension element 6a is formed with the first width w1 (which may for example be equal to 8.6 μm, that is with a reduction of 0.8 μm with respect to the second width w2).

This asymmetrical arrangement allows, in the example, to obtain a percentage increase equal to 3.4% of the opening angle of the tiltable structure 2 (which increases its value from 13.66° to 14.14°) with the same bias voltage applied to the piezoelectric structure 13 of the driving arms; at the same time, the sensitivity of the piezoresistive sensor 20 is kept substantially unchanged.

According to an aspect, the differential reduction in torsional stiffness of one of the elastic suspension elements 6a, 6b with respect to the other is such that the percentage difference between the first torsional stiffness and the second torsional stiffness is comprised between 10% and 50%; moreover, the percentage difference between the first width w1 and the second width w2 may be comprised between 2% and 50%.

In particular, the possibility of decreasing the aforementioned first width w1 even by 50% with respect to the second width w2 has been verified; a greater decrease, although it may potentially lead to an even greater increase in the opening angle, might in fact entail an excessive reduction in shock resistance, in particular along the orthogonal axis z and along the second horizontal axis y, due to the increased extent of movement (so-called "displacement") of the elastic suspension element having the reduced width.

In other words, the second width w2 differs from the first width w1 preferably by no more than 50%, in order to avoid robustness problems for the microelectromechanical device 1.

A further embodiment provides for a particular shape of one or both of the elastic suspension elements 6a, 6b, which in this case have a substantially a "T" shape.

Figure 5A:
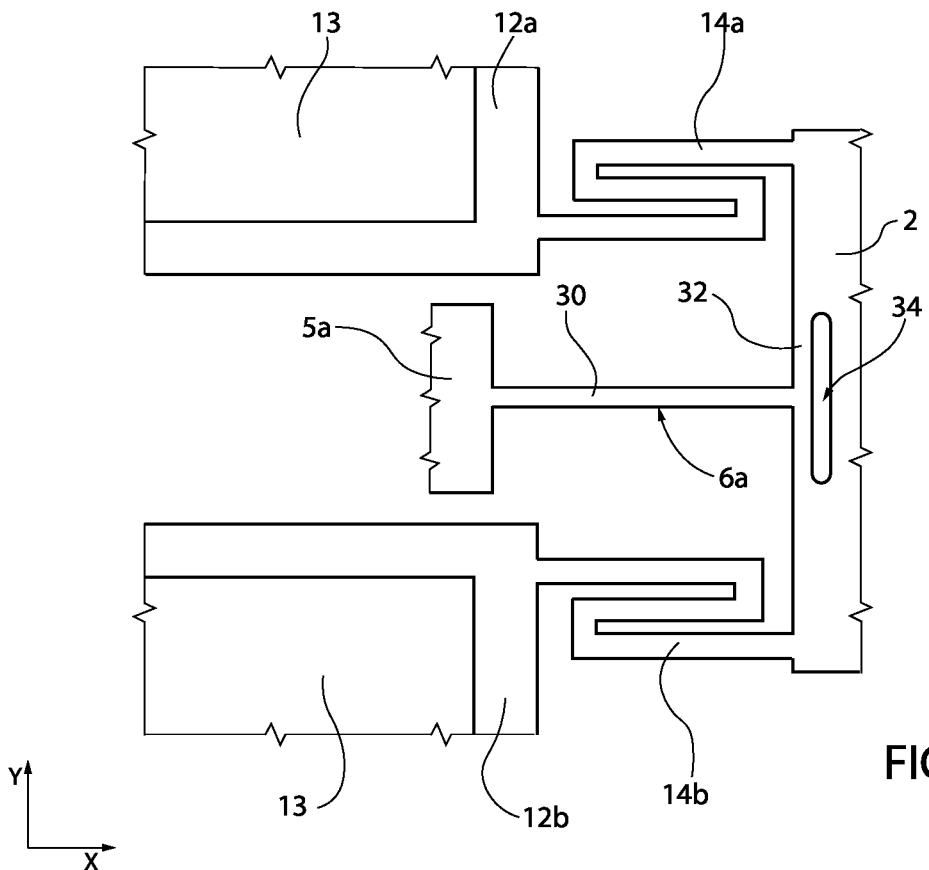
FIGS. 5A and 5B show enlarged portions of the microelectromechanical mirror device, according to further embodiments.
Figure 5B:
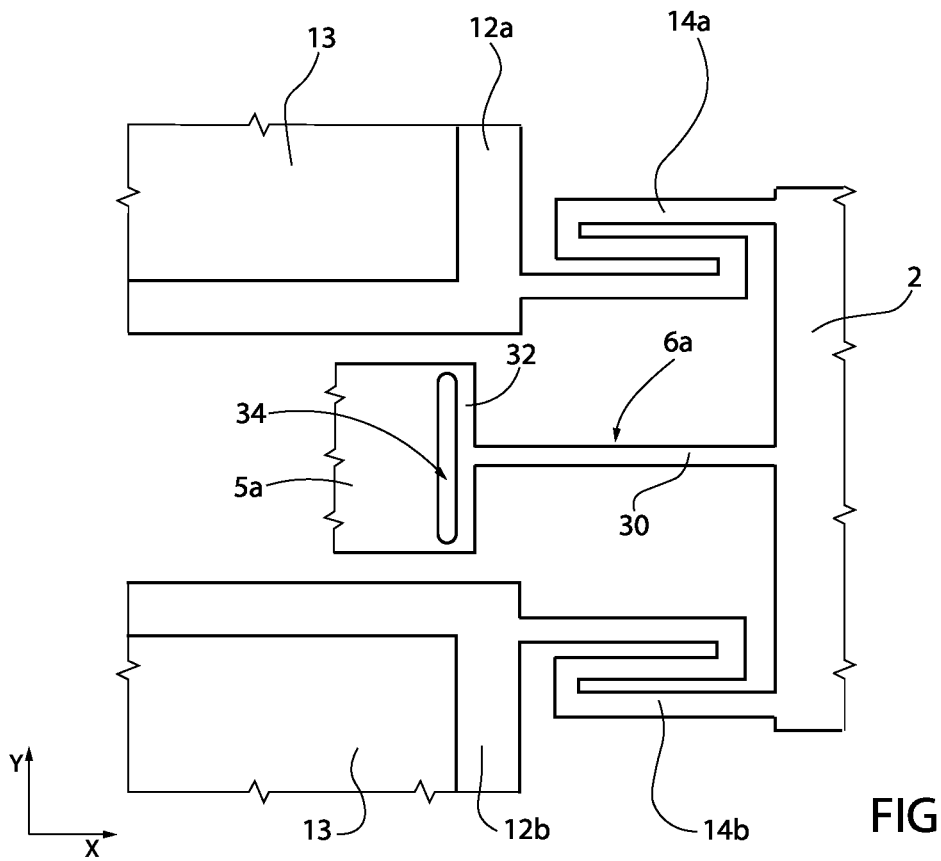

As illustrated in FIG. 5A and in FIG. 5B, one or both of the elastic suspension elements 6a, 6b (in the example illustrated, the first elastic suspension element 6a) in this case have: a body portion 30, having a substantially linear extension, in the embodiment illustrated along the first horizontal axis x; and a head portion 32, also having a substantially linear extension, in the embodiment illustrated along the second horizontal axis y, orthogonally with respect to the body portion 30.

In particular, the aforementioned body and head portions 30, 32 substantially have a same width in the direction transverse to the aforementioned linear extension, in the horizontal plane xy, corresponding to the aforementioned first or second width (what has been previously discussed on the asymmetrical arrangement of the elastic suspension elements being in fact valid also in this case). In the example shown in FIGS. 5A and 5B, the body and head portions 30, 32 both have substantially the same first width w1 (the corresponding first elastic suspension element 6a being associated with the first support element 5a without a piezoresistive sensor).

In greater detail, in a possible implementation, shown in FIG. 5A, the aforementioned head portion 32 is formed in the tiltable structure 2, at the connecting portion with the respective elastic suspension element (in the example with the first elastic suspension element 6a); an opening 34 is therefore formed in this case in the aforementioned connecting portion of the tiltable structure 2, having a main extension along the second horizontal axis y, so that the aforementioned head portion 32 is interposed between the same opening 34, on one side, and the cavity 3, on the other side (along the first horizontal axis x).

In a different implementation, shown in FIG. 5B, the aforementioned head portion 32 is formed instead in the associated support element (in the example, in the first support element 5a), at the connecting portion with the respective elastic suspension element (in the example with the first elastic suspension element 6a); the opening 34 is therefore formed in this case in the aforementioned connecting portion of the associated support element, having again a main extension along the second horizontal axis y, so that the aforementioned head portion 32 is interposed between the same opening 34, on one side, and the cavity 3, on the other side (again, along the first horizontal axis x).

It should be noted that, in this implementation, it is preferable that the piezoresistive sensor 20 is not formed at the support element 5a, 5b wherein the aforementioned head portion 32 of the elastic suspension element 6a, 6b is also formed.

The advantages of this disclosure are clear from the previous description.

In any case, it is again highlighted that this disclosure allows an increase in the opening angle of the microelectromechanical device 1 to be obtained, with minor structural changes with respect to structures of a known type and, in particular, keeping the size of the relative die 1' of semiconductor material unchanged and without requiring changes in the arrangement of the piezoelectric structure 13 of the driving arms 12a-12d.

In general, this disclosure allows fully exploiting the advantages of the piezoelectric actuation (i.e., the use of reduced bias voltages with a reduced energy consumption to obtain high displacements), while having improved mechanical and electrical performance compared to known solutions.

Advantageously, the microelectromechanical mirror device 1 may therefore be used in a picoprojector (or miniaturized projector) 40, which is operatively coupled to a portable electronic apparatus 41 (for example a smartphone or augmented reality glasses), as schematically illustrated with reference to FIG. 6.

Figure 6:
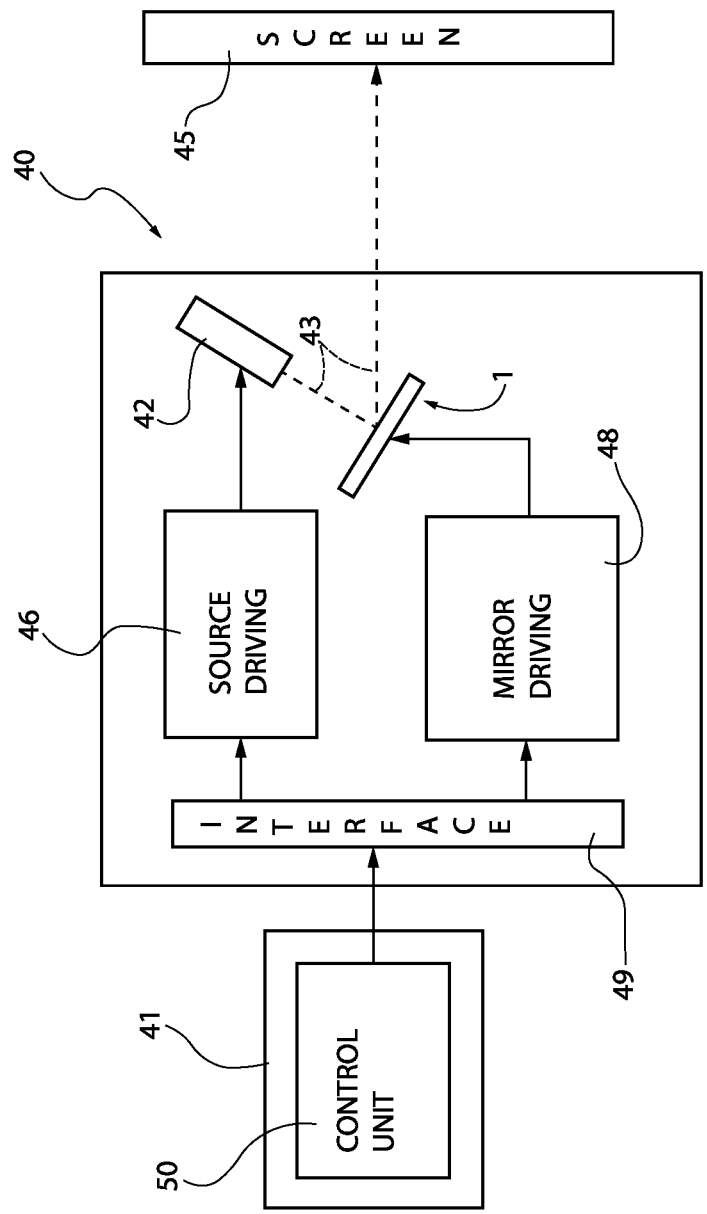
FIG. 6 is a schematic block diagram of a picoprojector using the microelectronic mirror device.

In detail, the picoprojector 40 of FIG. 6 comprises a light source 42, for example of a laser type, for generating a light beam 43; the microelectronic device 1, acting as a mirror and for receiving the light beam 43 and directing it towards a screen or display surface 45 (external and arranged at a distance from the picoprojector 40); a first driving circuit 46, for providing suitable control signals to the light source 42, for the generation of the light beam 43 based on an image to be projected; a second driving circuit 48, for providing driving signals to the actuation structure of the microelectronic mirror device 1; and a communication interface 49, for receiving, from a control unit 50, which is external, for example being included in the portable apparatus 41, information about the image to be generated, for example in the form of a pixel matrix. This information is sent at the input for driving the light source 42.

Finally, it is clear that modifications and variations may be made to what has been described and illustrated without thereby departing from the scope of this disclosure.

In particular, this disclosure may also be applied in the case of a biaxial embodiment of the microelectromechanical mirror device 1 (in a manner similar to what has been described in detail in the aforementioned United States Patent Application No. 2020/0192199), that is in the case wherein the tiltable structure 2 is capable of performing rotation movements both around the first rotation axis (coinciding with the first median axis of symmetry X parallel to the first horizontal axis x), and around a second rotation axis (coinciding with the second median axis of symmetry Y parallel to the second horizontal axis y).

Furthermore, variations may generally be provided regarding the shape of the elements forming the microelectromechanical mirror device 1, for example different shapes of the tiltable structure 2 (and of the corresponding reflecting surface 2'), or different shapes and/or arrangements of the driving arms 12a-12d.

Furthermore, the first and second elastic suspension elements 6a, 6b might be, instead of a linear type, alternatively of a folded type.

The invention claimed is:

1. A microelectromechanical mirror device, comprising:
a fixed structure defining a cavity;
a tiltable structure carrying a reflecting surface, wherein the tiltable structure is elastically suspended above the cavity and has a main extension in a horizontal plane;
at least one first pair of driving arms elastically coupled to the tiltable structure and carrying respective piezoelectric material regions configured to be biased to cause a rotation of the tiltable structure around a first rotation axis parallel to a first horizontal axis of said horizontal plane; and
elastic suspension elements configured to couple said tiltable structure elastically to said fixed structure at said first rotation axis, said elastic suspension elements being stiff with respect to movements out of the horizontal plane and yielding with respect to torsion around said first rotation axis, said elastic suspension elements extending between said tiltable structure and said fixed structure;
wherein said elastic suspension elements comprise first and second elastic suspension elements coupled to said tiltable structure on opposite sides along said first horizontal axis; wherein said first elastic suspension element has a first torsional stiffness and said second elastic suspension element has a second torsional stiffness, the second torsional stiffness being different from the first torsional stiffness.

2. The microelectromechanical mirror device according to claim 1, wherein said first and second elastic suspension elements extend along said first rotation axis and have respective first and second widths along a second axis of said horizontal plane, which is orthogonal to said first horizontal axis, said first width being different from said second width.

3. The microelectromechanical mirror device according to claim 2, wherein a percentage difference between said second width and said first width is between 2% and 50%.

4. The microelectromechanical mirror device according to claim 1, wherein a percentage difference between said second torsional stiffness and said first torsional stiffness is between 10% and 50%.

5. The microelectromechanical mirror device according to claim 1, further comprising a piezoresistive sensor configured to provide a detection signal associated with the rotation of the tiltable structure around the first rotation axis; and wherein said piezoresistive sensor is arranged in proximity to said second elastic suspension element and said first torsional stiffness is smaller than said second torsional stiffness.

6. The microelectromechanical mirror device according to claim 5, wherein said fixed structure forms, in the horizontal plane, a frame which delimits and surrounds said cavity, and also has first and second support elements extending longitudinally along said first rotation axis inside the cavity from said frame on opposite sides of said tiltable structure; and wherein said first and second elastic suspension elements extend between said tiltable structure and a respective one of said first and second support elements; and wherein said piezoresistive sensor is formed at the second support element.

7. The microelectromechanical mirror device according to claim 5, wherein said first and second elastic suspension elements extend along said first rotation axis and have a respective first and second width along a second axis of said horizontal plane, which is orthogonal to said first horizontal axis; and wherein said first width is smaller than said second width.

8. The microelectromechanical mirror device according to claim 1, wherein said first and second elastic suspension elements have a linear extension along said first rotation axis.

9. The microelectromechanical mirror device according to claim 1, wherein at least one of said first and second elastic suspension elements has a "T" shape, the "T" shape having a body portion with extending linearly along the first horizontal axis and a head portion with extending linearly along a second horizontal axis, orthogonally with respect to the body portion.

10. The microelectromechanical mirror device according to claim 9, wherein said body and head portions have a same width in a direction transverse to the linear extension along the first horizontal axis and the second horizontal axis, said same width corresponding to said first width or said second width.

11. The microelectromechanical mirror device according to claim 10, wherein said head portion is formed in the tiltable structure at a connecting portion with the respective elastic suspension element; and wherein an opening is formed in said connecting portion of the tiltable structure having a main extension along the second horizontal axis so that said head portion is interposed between said opening on one side and said cavity on the other side.

12. The microelectromechanical mirror device according to claim 10, wherein said fixed structure forms, in the horizontal plane, a frame which delimits and surrounds said cavity, and also has first and second support elements extending longitudinally along said first rotation axis inside the cavity from said frame on opposite sides of said tiltable structure; wherein said elastic suspension elements extend between said tiltable structure and a respective one of said first and second support elements; and wherein said head portion is formed in the associated support element at a connecting portion with the respective elastic suspension element, and further comprising an opening in said connecting portion of the associated support element having a main extension along the second horizontal axis so that said head portion is interposed between said opening on one side and the cavity on the other side.

13. The microelectromechanical mirror device according to claim 1, further comprising elastic decoupling elements which couple said tiltable structure to said driving arms of said first pair on opposite sides of and in proximity to the first rotation axis, and wherein said elastic decoupling elements are stiff with respect to movements out of the horizontal plane and yielding with respect to torsion around an axis parallel to said first rotation axis.

14. The microelectromechanical mirror device according to claim 1, further comprising a second pair of driving arms arranged symmetrically to the first pair of driving arms with respect to a second horizontal axis of said horizontal plane, said second horizontal axis being orthogonal to said first horizontal axis; wherein said driving arms of said second pair carry respective piezoelectric material regions and are elastically coupled to the tiltable structure on opposite sides of and in proximity to the first rotation axis through respective elastic decoupling elements, wherein said elastic decoupling elements are stiff with respect to movements out of the horizontal plane and yielding with respect to torsion around said first rotation axis.

15. A picoprojector apparatus, comprising:
a microelectromechanical mirror device, comprising:
a fixed structure defining a cavity;
a tiltable structure carrying a reflecting surface, said tiltable structure being elastically suspended above the cavity and having a main extension in a horizontal plane;
at least one first pair of driving arms elastically coupled to the tiltable structure and carrying respective piezoelectric material regions configured to cause a rotation of the tiltable structure around a first rotation axis parallel to a first horizontal axis of said horizontal plane; and
elastic suspension elements configured to couple said tiltable structure elastically to said fixed structure at said first rotation axis, said elastic suspension elements extending between said tiltable structure and said fixed structure;
wherein said elastic suspension elements have an asymmetrical arrangement on opposite sides of said tiltable structure along said first horizontal axis;
a light source operable to generate a light beam based on an image to be generated; and
a driving circuit configured to provide electrical driving signals to cause the rotation of said tiltable structure.

16. The picoprojector apparatus according to claim 15, wherein said elastic suspension elements comprise first and second elastic suspension elements coupled to said tiltable structure on opposite sides along said first horizontal axis; wherein said first elastic suspension element has a first torsional stiffness and said second elastic suspension element has a second torsional stiffness, the second torsional stiffness being different from the first torsional stiffness.

17. The picoprojector apparatus according to claim 16, wherein said first and second elastic suspension elements extend along said first rotation axis.

18. The picoprojector apparatus according to claim 15, wherein said fixed structure forms, in the horizontal plane, a frame which delimits and surrounds said cavity, and also has first and second support elements extending longitudinally along said first rotation axis inside the cavity from said frame on opposite sides of said tiltable structure; and wherein said elastic suspension elements extend between said tiltable structure and a respective one of said first and second support elements.

19. The picoprojector apparatus according to claim 18, further comprising a piezoresistive sensor configured to provide a detection signal associated with the rotation of the tiltable structure around the first rotation axis; and wherein said piezoresistive sensor is formed at the second support element.

20. The picoprojector apparatus according to claim 16, wherein at least one of said first and second elastic suspension elements has a body portion with extending linearly along the first horizontal axis and a head portion with extending linearly along a second horizontal axis orthogonally with respect to the body portion.

21. The picoprojector apparatus according to claim 20, wherein said body and head portions have a same width in a direction transverse to the linear extension along the first horizontal axis and along the second axis, said same width corresponding to said first width or said second width.

* * * * *